United States Patent
Sai

(10) Patent No.: US 7,801,192 B2
(45) Date of Patent: Sep. 21, 2010

(54) MONITORING METHOD AND VCSEL ARRAY WITH MONITORING FUNCTION

(75) Inventor: Hironobu Sai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 206 days.

(21) Appl. No.: 12/051,385

(22) Filed: Mar. 19, 2008

(65) Prior Publication Data

US 2008/0240185 A1 Oct. 2, 2008

(30) Foreign Application Priority Data

Mar. 27, 2007 (JP) ............................. 2007-081800

(51) Int. Cl.
 *H01S 3/00* (2006.01)
 *H01S 5/00* (2006.01)
 *H01L 29/74* (2006.01)
(52) U.S. Cl. ............ 372/38.01; 372/38.07; 372/50.122; 257/190
(58) Field of Classification Search ............. 372/38.01, 372/38.03, 38.07, 29.015, 50.1, 50.122; 257/99, 257/190; 356/73.1
See application file for complete search history.

(56) References Cited

U.S. PATENT DOCUMENTS

| | | | |
|---|---|---|---|
| 5,801,402 A * | 9/1998 | Shin ............................. | 257/80 |
| 5,809,050 A | 9/1998 | Baldwin et al. ................ | 372/43 |
| 6,891,869 B2 * | 5/2005 | Augusto .................. | 372/43.01 |
| 2001/0048643 A1* | 12/2001 | Inoue et al. .................... | 369/13 |

FOREIGN PATENT DOCUMENTS

JP 2006-179641 7/2006
JP 2006179641 A * 7/2006

* cited by examiner

*Primary Examiner*—Minsun Harvey
*Assistant Examiner*—Patrick Stafford
(74) *Attorney, Agent, or Firm*—Fitzpatrick, Cella, Harper & Scinto

(57) ABSTRACT

VCSEL array with a structure in which vertical cavity surface emitting devices are arranged on a substrate. The VCSEL array includes first and second optical devices. The second optical device receives light that is directed parallel to the substrate and emitted from the first optical device and converts the light into an electric signal when a voltage applied to the second optical device is switched to a reverse bias. The second optical device emits light that is directed parallel to the substrate when a voltage applied to the second optical device is switched to a forward bias.

10 Claims, 9 Drawing Sheets

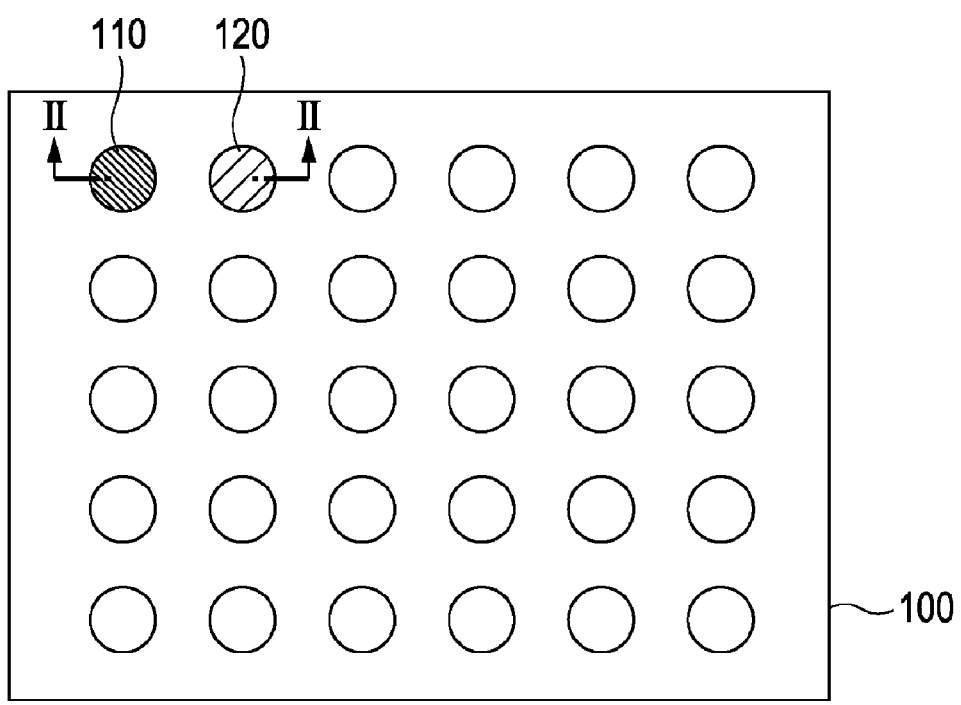

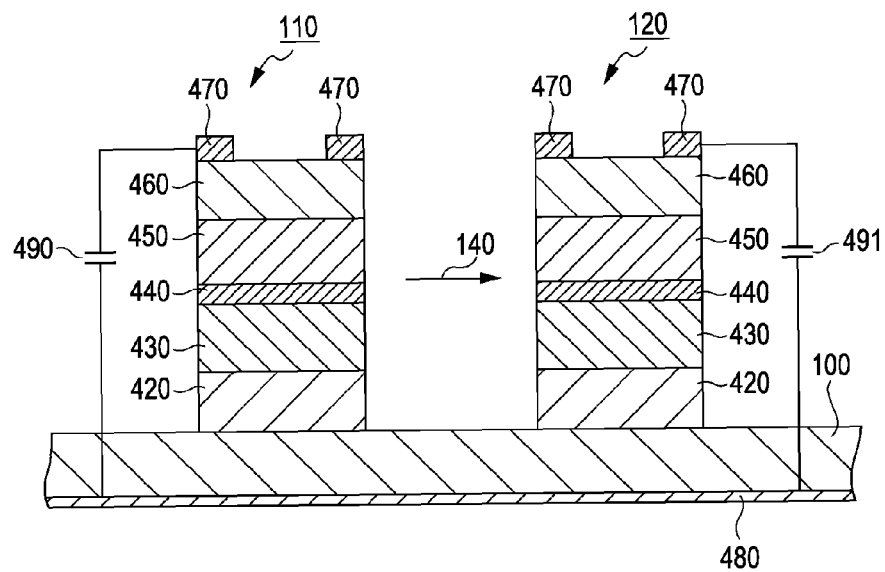
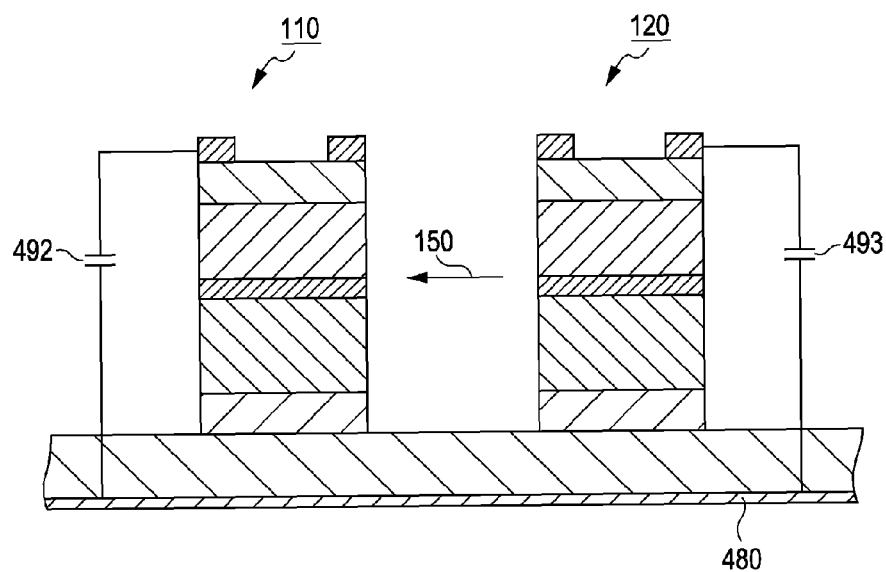

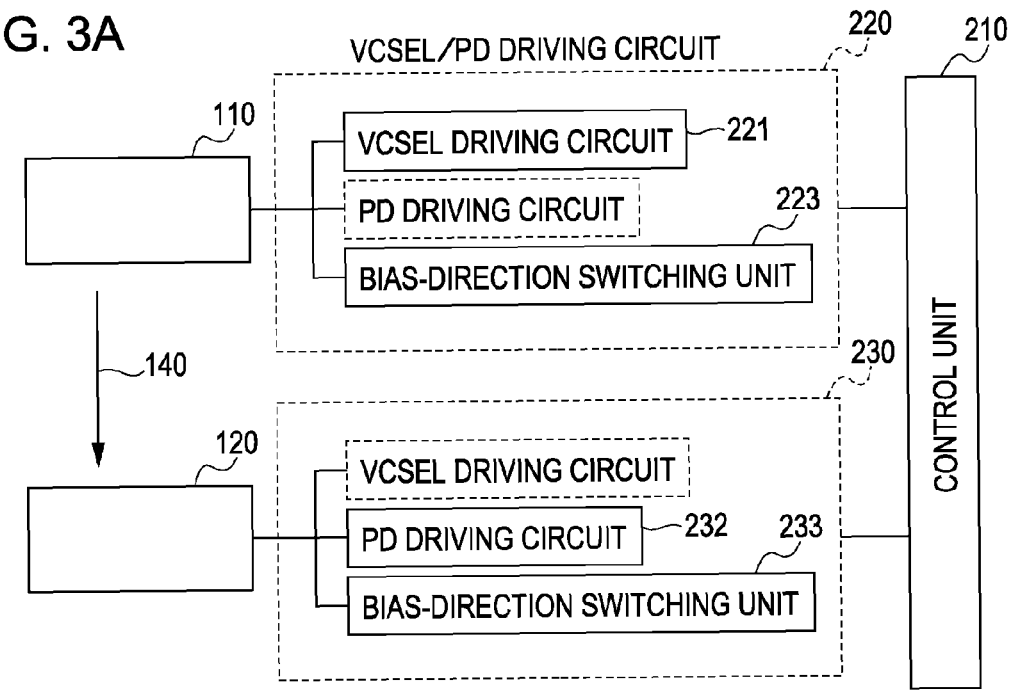
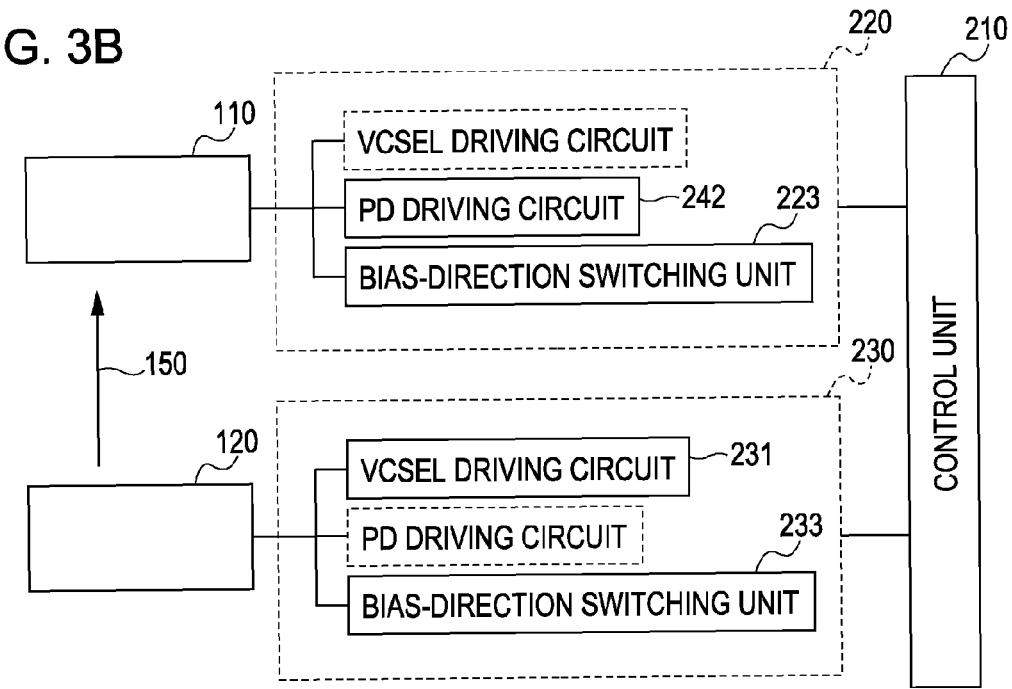

MONITORING METHOD AND VCSEL ARRAY WITH MONITORING FUNCTION

BACKGROUND OF THE INVENTION

1. Field of the Invention

The present invention relates to a monitoring method used to monitor an optical output of a vertical cavity surface emitting laser (VCSEL) array and a VCSEL array on which monitoring is performed.

2. Description of the Related Art

A VCSEL is a type of semiconductor laser that is designed to emit light at right angles with respect to a semiconductor substrate. A number of such VCSEL lasers can be integrated and arranged in a two-dimensional array. When the VCSEL array is applied as a light source for exposure in an electrophotography apparatus, parallel processing on a printing operation using multiple beams can be achieved, thereby improving resolution and increasing print speed.

If the VCSEL is used as the light source of an electrophotography apparatus, such an apparatus detects an optical output obtained from the VCSEL with an optical sensor and controls the driving voltage (the driving current) of the VCSEL on the basis of the detection result.

U.S. Pat. No. 5,809,050 (p. 12 and FIG. 8B) describes an example monitoring apparatus of the related art. The monitoring apparatus has a VCSEL and an optical sensor that are included in the same package, detects a part of a laser beam emitted from the VCSEL, and monitors the light quantity of that part of the laser beam. The monitoring apparatus disclosed in U.S. Pat. No. 5,809,050 (p. 12 and FIG. 8B) is described below with reference to FIG. 9 of the present application.

A VCSEL 710 and an additional laser structure 720 are electrically isolated from each other by a reduced-conductivity material 730. The VCSEL 710 is structurally similar to the additional laser structure 720. When subject to a reverse bias opposite in polarity to the electrical potential of the driving current of the VCSEL 710, the additional laser structure 720 operates as an optical sensor.

Electrodes 740 and 741 are formed to overlap the VCSEL 710, and electrodes 745 and 746 are formed to overlap the optical sensor. A first cladding layer 750 overlies the electrodes 741 and 745. A core layer 760 overlies the first cladding layer 750. A second cladding layer 770 is stacked on the core layer 760. The core layer 760 has a diffraction grating 780. The refractive index of the core layer 760 is greater than that of the first cladding layer 750 and that of the second cladding layer 770. Therefore, light can be confined within the core layer 760.

A laser beam 701 generated by the VCSEL 710 travels in the core layer 760. The laser beam 701 partially passes through the core layer 760 and becomes an output light beam 702. The remainder of the laser beam 701 is diffracted by the diffraction grating 780 and becomes diffracted light 703. The diffracted light 703 travels along an optical waveguide formed by the first cladding layer 750, the core layer 760, and the second cladding layer 770, and then enters the additional laser structure 720. The additional laser structure 720 operates as an optical sensor when subject to a reverse bias, and a current is generated from the additional laser structure 720 on the basis of the intensity of the diffracted light 703. A control circuit 790 operates in response to the current supplied from the additional laser structure 720 via a conductor 791, and feeds a current to the VCSEL 710 via a conductor 792. The VCSEL 710 can control the output light beam 702 to have a predetermined intensity by controlling this current.

If the VCSEL array is assumed to be used as a light source of the electrophotography apparatus, it is required to monitor each of light-emitting devices arranged in an array.

For example, if the VCSEL array is used as the light source of the electrophotography apparatus, even if the currents flowing through the devices are equal to one another, optical outputs obtained from the devices may be different due to changes over time.

Depending on the printing pattern being used, a driving period for a certain light-emitting device (a device A) can be different from that for another light-emitting device (a device B). Thus, when the driving period for the device A is longer than that for the device B, a quantity of heat generated from the device A is greater than that generated from the device B. The optical output of the VCSEL is affected by heat, and thus even if equal currents are fed to the devices A and B, their optical outputs may be different from each other.

Therefore, the light-emitting devices arranged in the array need to be individually monitored.

However, if the above-discussed monitoring apparatus disclosed in U.S. Pat. No. 5,809,050 is applied to a VCSEL array, and the light-emitting devices are individually monitored, as many optical sensors as there are the light-emitting devices need to be additionally provided. Thus, the complexity of the apparatus is increased.

SUMMARY OF THE INVENTION

The present invention provides a monitoring method used to monitor each of plural light-emitting devices arranged in a VCSEL array without having to provide as many optical sensors as there are light-emitting devices. More specifically, a dedicated optical sensor is not needed for each light-emitting device because a plurality of the devices are configured to switch between light emitting and optical sensing functions.

The present invention provides a VCSEL array capable of monitoring each of light-emitting devices arranged in the VCSEL array using a simple structure.

A monitoring method according to an aspect of the present invention is as follows. The method for monitoring an optical output from a vertical cavity surface emitting laser array in which a plurality of vertical cavity surface emitting devices are arranged on a substrate includes (1) causing a first optical device to emit light that is directed parallel to the substrate by changing a bias direction of a voltage applied to the first optical device to a forward direction, (2) causing a second optical device to receive the light emitted from the first optical device and to convert the quantity of light emitted from the first optical device into an electric signal by changing a bias direction of a voltage applied to the second optical device to a reverse direction, (3) causing the second optical device to emit light in a direction parallel to the substrate by changing a bias direction of a voltage applied to the second optical device to a forward direction, and (4) causing a third optical device to receive the light emitted from the second optical device and to convert the quantity of light emitted from the second optical device into an electric signal by changing a bias direction of a voltage applied to the third optical device to a reverse direction. An apparatus for performing this method is also contemplated as part of the invention.

For example, a vertical cavity surface emitting laser array according to an aspect of the present invention is as follows. A plurality of vertical cavity surface emitting devices are arranged on a substrate in the vertical cavity surface emitting laser array. The vertical cavity surface emitting laser array includes a first optical device, a second optical device, and a bias-direction switching unit configured to switch a bias direction of a voltage applied to the second optical device between forward and reverse.

According to the present invention, the monitoring method used to monitor each of the light-emitting devices arranged in the VCSEL array can be provided without providing as many optical sensors as there are light-emitting devices.

According to the present invention, the VCSEL array capable of monitoring each of the light-emitting devices arranged in the VCSEL array using a simple structure can be provided.

Further features of the present invention will become apparent from the following description of exemplary embodiments with reference to the attached drawings.

BRIEF DESCRIPTION OF THE DRAWINGS

FIG. 1 is a top view of a VCSEL array used to describe a first embodiment according to the present invention.

FIGS. 2A and 2B are sectional views taken along line II-II shown in FIG. 1.

FIGS. 3A and 3B are functional block diagrams used to describe the first embodiment.

DESCRIPTION OF THE EMBODIMENTS

First Embodiment

Figure 4:
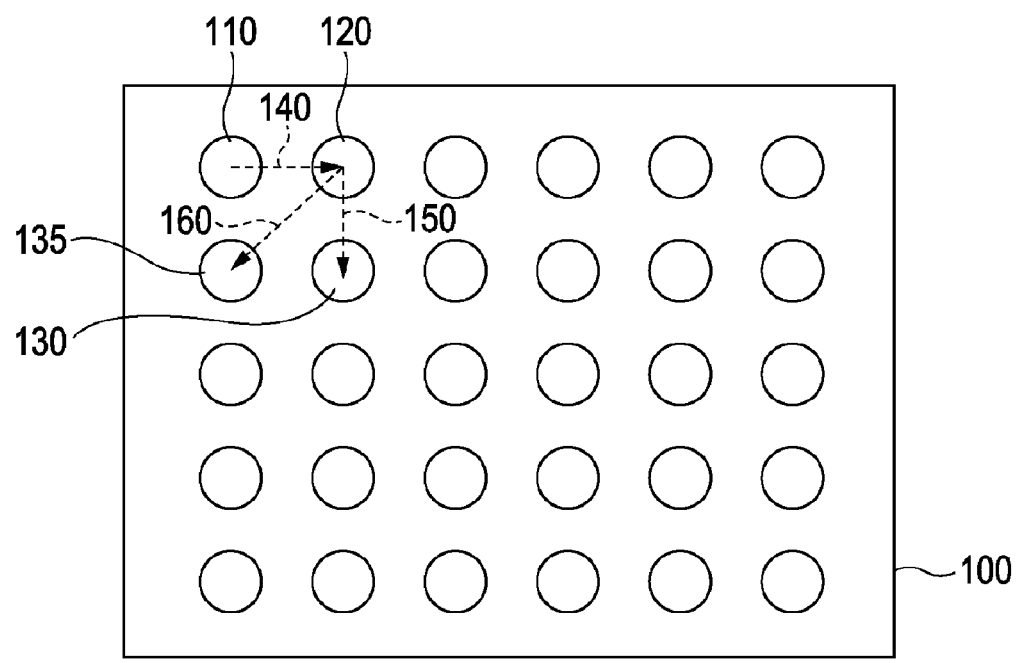
FIG. 4 is a top view of a VCSEL array used to describe a second embodiment according to the present invention.

In a first embodiment, an example in which the direction of a bias applied to a VCSEL 110 (a first optical device) and that applied to a VCSEL 120 (a second optical device) are mutually switched is described.

FIG. 1 shows a VCSEL array in which a plurality of VCSELs are arranged. In FIG. 1, circles arranged in a six by five matrix on a substrate 100 schematically indicate the VCSELs. The VCSEL 110 and the VCSEL 120 are provided to be next to each other.

FIG. 2A is a sectional view taken along line II-II shown in FIG. 1. The VCSEL 110 shown in a left part of FIG. 2A has a structure in which a lower distributed Bragg-reflector (DBR) mirror 420, a lower cladding layer 430, an active layer 440, an upper cladding layer 450, and an upper DBR mirror 460 are formed in this order on the substrate 100.

A p-type electrode 470 is formed on the upper DBR mirror 460, and an n-type electrode 480 is provided to the substrate 100. In order to electrically connect the p-type electrode 470 and the n-type electrode 480, a voltage-applying unit 490 is provided therebetween.

The VCSEL 120 shown in a right part of FIG. 2A has a structure identical to that of the VCSEL 110. A voltage-applying unit 491 is provided between the p-type electrode 470 and the n-type electrode 480 provided for the VCSEL 120.

When a forward bias is applied to the VCSEL 110 by the voltage-applying unit 490, holes and electrons are injected into the active layer 440 because of the presence of an electric potential difference. Afterwards, because of recombination of carriers, spontaneous emission light is emitted as light 140 that is directed parallel to the substrate 100.

A bias opposite the bias applied by the voltage-applying unit 490 (that is, a reverse bias) is applied to the VCSEL 120 by the voltage-applying unit 491, and thus the VCSEL 120 operates as an optical sensor. Here, the reverse bias may be a zero bias (that is, no bias is applied).

When a bias is not applied to the VCSEL 120, light entering a depletion layer of the VCSEL 120 causes a current to be generated. Thus, the VCSEL 120 can be used as an optical sensor. If a reverse bias greater than zero is applied, a photocurrent increases because the depletion layer of the VCSEL 120 becomes thicker compared to the case in which no bias is applied. Thus, the VCSEL 120 can be used as an optical sensor with higher sensitivity. There is a correlation between the current generated by irradiation with the light and the quantity of the light received. The light received will be related to a laser light output emitted from the VCSEL 110. Therefore, by monitoring a current generated by the VCSEL 120, an output from the VCSEL 110 can be determined.

In the example described in the first embodiment according to the present invention, there is included a bias-direction switching unit that can switch the bias direction of a voltage applied to the VCSEL 110 and a bias-direction switching unit that can switch the bias direction of a voltage applied to the VCSEL 120. FIG. 2B shows an example in which the bias direction of a voltage applied to the VCSEL 110 and that of a voltage applied to the VCSEL 120 shown in FIG. 2A are switched between reverse and forward by using the bias-direction switching units. After the bias directions are switched like this, the VCSEL 110, which was previously operating as a light-emitting device, starts to operate as an optical sensor. Also, the VCSEL 120, which was previously operating as an optical sensor, starts to operate as a light-emitting device.

More specifically, a forward bias is applied to the VCSEL 120 by a voltage-applying unit 493, and this causes light 150 that is directed parallel to the substrate 100 to be emitted. A reverse bias is applied to the VCSEL 110 by a voltage-applying unit 492, and thus the light 150 that is directed parallel to the substrate 100 is converted into a current. The voltage-applying unit 493 is controlled on the basis of this current.

The light 140 and the light 150 that are directed parallel to the substrate 100 are spontaneous emission light until laser oscillation starts. However, when carrier injection exceeds a certain threshold, laser oscillation starts, and laser scattering light that is scattered at, for example, an oxidized confinement layer is emitted as the light 140 or the light 150 which is directed parallel to the substrate 100. Therefore, when such laser oscillation starts, the light 140 and the light 150 that are directed parallel to the substrate 100 are each a sum of spontaneous emission light and a part of the laser light scattered at, for example, the oxidized confinement layer (laser scattering light).

A method of controlling the VCSEL 110 and the VCSEL 120 will be described with reference to FIG. 3. In the following drawings, components the same as those indicated above will be denoted by the same reference numerals.

An example in which the VCSEL 110 operates as a light-emitting device and the VCSEL 120 operates as an optical sensor will be described.

In FIG. 3A, a control unit 210 used to perform image processing sends a command to a VCSEL/PD driving circuit 220 used to drive the VCSEL 110 and a photodetector (PD). This command causes a bias-direction switching unit 223 to switch the bias direction and a VCSEL driving circuit 221 to apply a forward bias to the VCSEL 110. As a result, the light 140 that is directed parallel to the substrate 100 is emitted from the VCSEL 110.

For the VCSEL 120, a command sent from the control unit 210, which performs image processing, causes a bias-direction switching unit 233 included in a VCSEL/PD driving circuit 230 to switch the bias direction. This causes a PD driving circuit 232 to apply a reverse bias, and the VCSEL 120 operates as an optical sensor for detecting the light 140 that is directed parallel to the substrate 100. The light 140 that is directed parallel to the substrate 100 and detected by the VCSEL 120 is converted into an electric signal on the basis of the quantity of the light 140. The electric signal is sent from the PD driving circuit 232 to the control unit 210. Data processing is performed on the electric signal in the control unit 210, which performs image processing. The data-processing result is supplied to the VCSEL driving circuit 221, and the VCSEL driving circuit 221 controls a current and sets the current so as to cause an optical output obtained from the VCSEL 110 to have a desired value.

Next, an example in which the VCSEL 120 (the second optical device) operates as a light-emitting device and the VCSEL 110 (the first optical device) operates as an optical sensor will be described.

In FIG. 3B, the command received from the control unit 210, which performs image processing, causes the bias-direction switching unit 233 to switch the bias direction. A reverse bias which was previously applied is switched to a forward bias, and the VCSEL driving circuit 231 applies the forward bias to the VCSEL 120. This causes the light 150 that is directed parallel to the substrate 100 to be emitted from the VCSEL 120. On the other hand, a PD driving circuit 242 applies a reverse bias to the VCSEL 110, and thus the VCSEL 110 operates as an optical sensor.

With the above-described structure according to the first embodiment, an output from the VCSEL 110 (the first optical device) can be detected by the VCSEL 120 (the second optical device), and an output from the VCSEL 120 can be detected by the VCSEL 110.

That is, in the first embodiment, each of the light-emitting devices arranged in the VCSEL array can be monitored without having to additionally provide as many optical sensors as the light-emitting devices.

The bias-direction switching unit can be realized by using a power switching circuit of a logic integrated circuit (IC). More specifically, an analog switch or a bus switch can be employed. A photocoupler can also be employed as the bias-direction switching unit. If a photocoupler is used, crosstalk affecting the VCSEL driving circuit and the PD driving circuit can be decreased, and thus the occurrence of malfunctions can be reduced.

If a logic IC is used as the bias-direction switching unit, the bias-direction switching unit may be included in the VCSEL/PD driving circuit as described above, or may also be integral with the control unit 210, which performs image processing.

If the control unit 210, which performs image processing, and the VCSEL/PD driving circuit are provided integrally, space savings, cost reduction, and a high-speed response can be achieved.

Moreover, the bias-direction switching unit may be implemented independently on another substrate provided in addition to the substrate on which the VCSEL/PD driving circuit is implemented. Thus, if circuits are independently implemented on separate substrates, a general-purpose IC can be employed. Therefore, the development cost can be reduced and design changes can be simplified.

An electric-signal amplifier circuit of a PD is a part of the VCSEL/PD driving circuit. The electric-signal amplifier circuit may be implemented inside a VCSEL/PD package and the VCSEL/PD driving circuit may be provided outside the VCSEL/PD package. If the electric-signal amplifier circuit is implemented inside the VCSEL/PD package, noise performance of the PD is improved, and sensitivity for photodetection is substantially improved.

The substrate 100 shown in FIGS. 2A and 2B can be appropriately selected from GaAs, GaN, sapphire, SiC, Si, InP, GaP, and the like in consideration of a desired wavelength range.

The active layer 440 can be appropriately selected from, for example, AlGaAs, AlGaInN, InGaAsP, and AlGaP.

The lower DBR mirror 420 and the upper DBR mirror 460 can each be appropriately selected from AlGaAs, AlGaInN, InGaAsP, and AlGaP.

The upper cladding layer 450 and the lower cladding layer 430 can each be appropriately selected from AlGaAs, AlGaInN, InGaAsP, and AlGaP.

The p-type electrode 470 can be formed of Ti/Au, Au/Zn/Au, or the like. The n-type electrode 480 can be formed of AuGe/Au, AuGeNi/Au, or the like.

In the apparatus disclosed in U.S. Pat. No. 5,809,050 (p. 12 and FIG. 8B), a mirror such as a diffraction grating needs to be used in order to monitor light emitted from a light-emission device; however, such a mirror is not always necessary in the first embodiment of the present invention.

As disclosed in U.S. Pat. No. 5,809,050 (p. 12 and FIG. 8B), it is known that a VCSEL is used as an optical sensor or a photodetector when a reverse bias is applied to the VCSEL. However, in that example, a VCSEL operates only as a light-emission device, and another VCSEL to which a reverse bias is applied operates only as an optical sensor. In contrast, the VCSEL 120 (the second optical device) can be switched between being a light-emission device and being an optical sensor in the first embodiment according to the present invention.

U.S. Pat. No. 5,809,050 (p. 12 and FIG. 8B) discloses a description about detecting laser light components emitted in a direction perpendicular to a substrate via a mirror or the like. In contrast, in the first embodiment according to the present invention, spontaneous-emission-light components emitted in a direction parallel to a substrate are mainly detected.

Second Embodiment

In the first embodiment, the example in which the bias directions applied to the VCSELs 110 and 120 are mutually switched was described. In a second embodiment, an example in which the direction of a bias applied to a plurality of VCSELs is switched will be described.

In FIG. 4, the VCSEL 110 (the first optical device), the VCSEL 120 (the second optical device), and a VCSEL 130 (a third optical device) are arranged on the substrate 100.

When an optical output from the VCSEL 110 (the first optical device) is monitored, a forward bias is applied to the VCSEL 110 (the first optical device). This causes the light 140 that is directed parallel to the substrate 100 to be emitted.

A reverse bias is applied to the VCSEL 120 (the second optical device), and this causes the light 140 to be detected.

When an optical output from the VCSEL 120 is monitored, the direction of a bias applied to the VCSEL 120 (the second optical device) is switched from reverse to forward by using the bias-direction switching unit. This causes the light 150 that is directed parallel to the substrate 100 to be emitted. A reverse bias is applied to the VCSEL 130 (the third optical device), and this causes the light 150 that is directed parallel to the substrate 100 to be detected.

A device other than the first optical device (the VCSEL 110) may detect the light caused to be emitted from the second optical device (the VCSEL 120) when the direction of the bias applied to the second optical device (the VCSEL 120) is switched. That is, the third optical device (the VCSEL 130) may detect the light emitted from the second optical device (the VCSEL 120).

The third optical device operating as an optical sensor may be arranged in a direction oblique to the VCSEL 120 (the second optical device), like a VCSEL 135, and may detect light 160 that is emitted from the VCSEL 120 and directed parallel to the substrate 100.

In the second embodiment, with the above-described structure, an optical output from a VCSEL arranged at an arbitrary position can be monitored by another VCSEL arranged at another arbitrary position. That is, according to the second embodiment of the present invention, there is provided a monitoring method with a high degree of flexibility and a VCSEL array on which monitoring with a high degree of flexibility can be performed.

The monitoring method described in the first embodiment can be expressed with the same wording as used in the second embodiment if we assume that the third optical device and the first optical device are the same.

Third Embodiment

A third embodiment relates to, for example, formation of an optical waveguide by filling a resin between the VCSELs. The optical waveguide guides a wave of spontaneous emission light efficiently to an optical sensor.

Figure 5A:
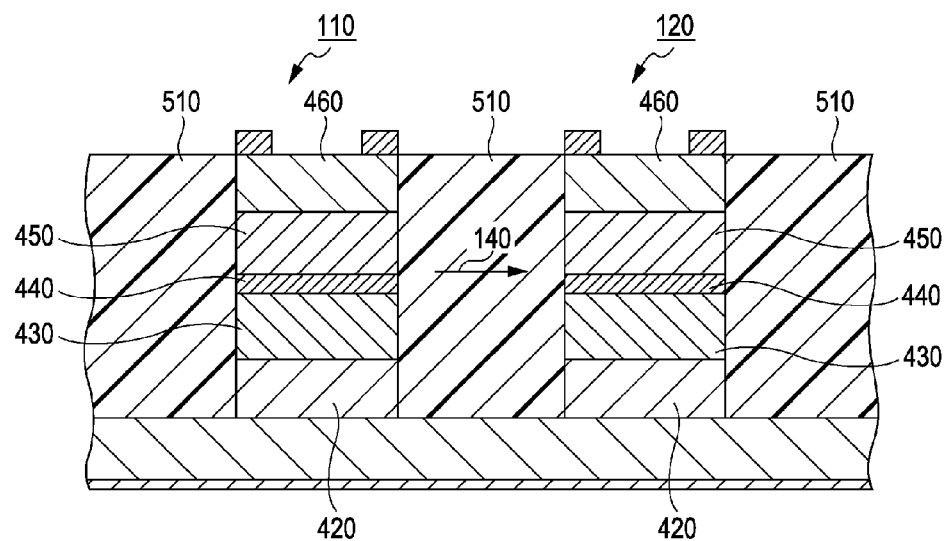
FIGS. 5A and 5B are top views of a VCSEL array used to describe a third embodiment according to the present invention.

FIG. 5A is a sectional view of a VCSEL array. A resin 510 is filled between the VCSEL 110 (the first optical device) and the VCSEL 120 (the second optical device).

In FIG. 2A for the first embodiment, the light 140 that is directed parallel to the substrate 100 propagates through air. However, in the third embodiment, the light 140 that is directed parallel to the substrate 100 propagates through the resin 510. The refractive index of air is about 1.0, and the refractive index of a resin is about 1.5. Thus, the refractive index of the resin is greater than that of air. Light propagating inside the resin is confined therein because of the difference between the refractive index of the resin and that of air. Thus, there is an advantage in that coupling efficiency of light for the VCSEL 120 is improved and detection efficiency of light is improved.

In the third embodiment, the quantity of the light sent from the VCSEL 110 and necessary for monitoring can be detected even in the case where it is necessary to arrange the VCSEL 120 to be some distance apart from the VCSEL 110 in order to reduce effects caused by heat generated at such a device.

The resin 510 is composed of a material with a refractive index greater than 1.0, which is the refractive index of air. There is an advantage in that if the refractive index of the material used as the resin 510 is closer to that of a material constituting the VCSEL 110, reflection occurring at an interface between the VCSEL 110 and the resin 510 can be more greatly reduced.

Materials that can be used for forming the resin 510 include a polyimide, benzocyclobutene (BCB), and a spin-on-glass (SOG).

A deposited film 310 may be employed instead of the resin 510. As the deposited film 310, an oxide film, for example, $SiO_2$ or $TiO_2$ or a nitride film, for example, SiN or AlN may be employed.

In FIG. 5A, the resin 510 is completely filled between the VCSELs 110 and 120; however, the resin 510 just has to be filled between the active layers 440 of the VCSELs 110 and 120 at least, because the light 140 that is directed parallel to the substrate 100 is mainly generated from the active layer 440 of the VCSEL 110.

Next, an example in which detection efficiency of light can be improved by forming an optical waveguide by using, for example, two or more kinds of resin will be described.

Figure 5B:
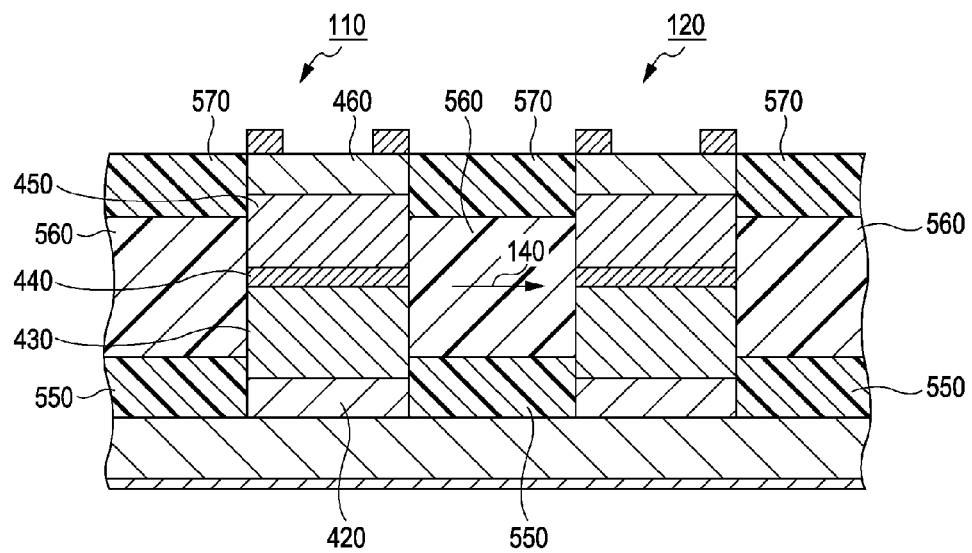

In FIG. 5B, a resin 550, a resin 560, and a resin 570 are filled and stacked in this order between the VCSELs 110 and 120. The refractive index of the resin 560 is greater than that of the resin 550 and that of the resin 570. With such a structure, the light 140 that is directed parallel to the substrate 100 and emitted from the active layer 440 of the VCSEL 110 is confined in the resin 560. Thus, a wave of the light 140 that is directed parallel to the substrate 100 can be efficiently guided to the VCSEL 120.

The resin 550, the resin 560, and the resin 570 just have to satisfy the above-described relationship between the refractive indices, and each of the resins 550, 560, and 570 can be appropriately selected from a polyimide, BCB, and an SOG. Similar advantages can be achieved by using deposited films instead of the resins. The deposited films can each be appropriately selected from, for example, $SiO_2$, $TiO_2$, or a nitride film SiN or AlN.

Fourth Embodiment

In a fourth embodiment, a VCSEL array in which more than two optical sensors are provided for one light-emitting device and a monitoring method will be described.

Figure 6:
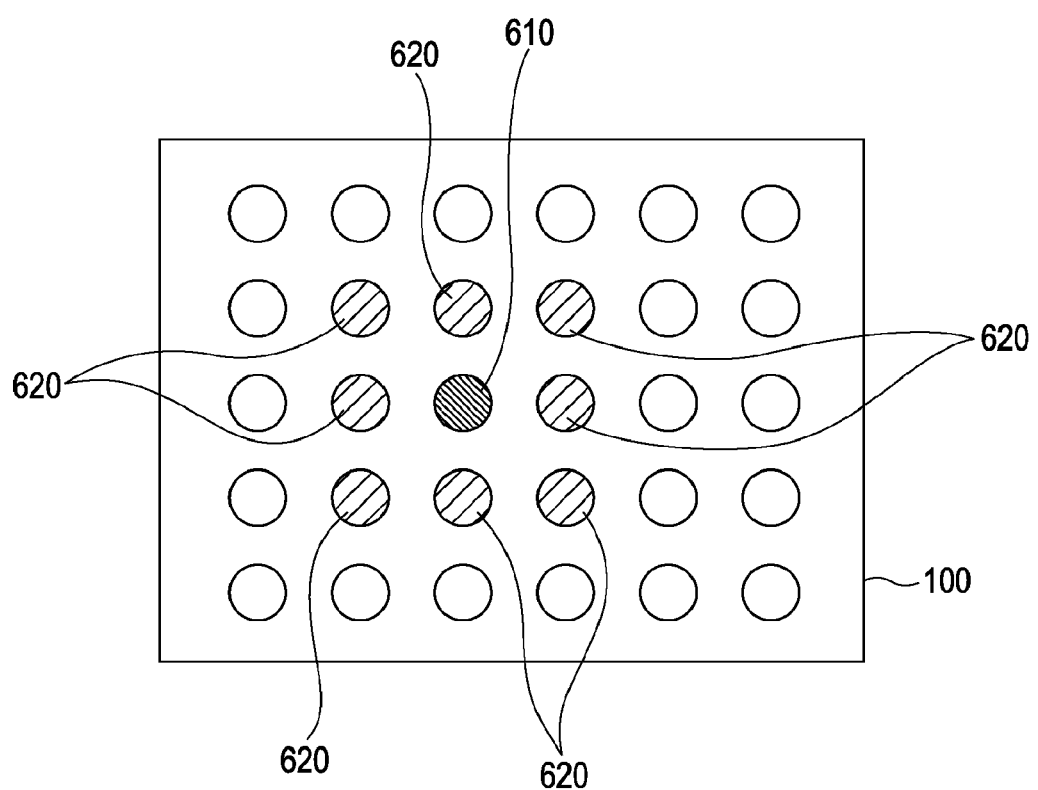
FIG. 6 is a top view of a VCSEL array used to describe a fourth embodiment according to the present invention.

In FIG. 6, a VCSEL 610 (a first optical device) and VCSELs 620 (second optical devices) are arranged on the substrate 100. Since a forward bias is applied to the VCSEL 610, the VCSEL 610 operates as a light-emitting device. Since a reverse bias is applied to the VCSELs 620, the VCSELs 620 operate as optical sensors.

The VCSELs 620 operating as optical sensors are arranged around the VCSEL 610. Since light that is directed parallel to the substrate 100 and is emitted from the VCSEL 610 travels in various directions from the VCSEL 610, such light can be detected by the VCSELs 620 arranged around the VCSEL 610. This means that a dedicated optical sensor is not needed for each light-emitting device because the VCSELs 620 are configured to switch between light emitting and optical sensing functions. This solves a problem that a light quantity of insufficient size obtained from just one optical sensor causes a failure in monitoring.

If such a VCSEL array is utilized as a light source of an electrophotography apparatus, a distance between the VCSELs (a pitch) should be narrower because it is required to improve image quality. Thus, it is assumed that optical devices that cannot operate as light-emitting devices but can operate only as optical sensors need to be disposed outside the package or in a peripheral area of the VCSEL array.

However, in order to dispose optical sensors outside the package, an optical system such as one including a mirror or the like is additionally required. If optical sensors for an exclusive use are disposed in a peripheral area of a VCSEL array, light emitted from a light-emitting device disposed in a central area (for example, the VCSEL 610 shown in FIG. 6) cannot reach the optical sensors, whereby monitoring cannot be performed because of a light quantity of insufficient size.

In contrast, if a structure as disclosed in the fourth embodiment is used, a VCSEL capable of operating as a light-emitting device is also used as an optical sensor when the direction of a bias is switched, whereby the above-described problem is solved.

Fifth Embodiment

A fifth embodiment includes a monitoring method according to the present invention and an example in which a VCSEL array is used as a light source of an electrophotography apparatus.

Figure 7:
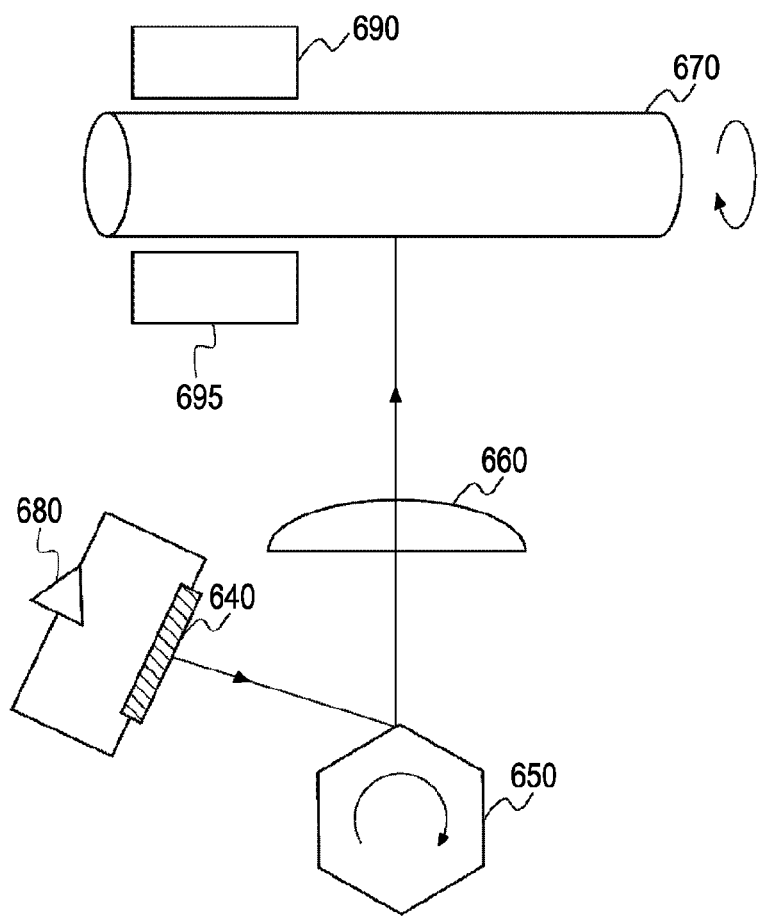
FIG. 7 is a schematic diagram, which is used to describe a fifth embodiment according to the present invention, concerning a case in which a VCSEL array is used as a light source for exposure in an electrophotography apparatus.

The electrophotography apparatus includes a photoconductor, a charging unit which is used to charge the photoconductor, a light-beam irradiation unit which irradiates the charged photoconductor with a light beam used to form an electrostatic image, and a developing unit which develops the electrostatic image formed by irradiation with the light beam. In the following, an image-forming process performed by such an electrophotography apparatus will be described with reference to FIG. 7.

A photoconductor 670 is uniformly charged by a charging unit 690. The photoconductor 670 is irradiated with laser light which is emitted from a VCSEL array 640 serving as a light source for exposure, and which travels via a polygonal mirror 650 serving as a light-path changing unit and a condenser lens 660. Since the photoconductor 670 is irradiated with laser light, charge is eliminated from an irradiated portion of the photoconductor 670, and an electrostatic image is formed. A developing unit 695 supplies toner, and a toner image is formed on the photoconductor 670 on which the electrostatic image is formed. This toner image is transferred to a transfer material, for example, a sheet of paper.

The light emitted from a VCSEL arranged in the VCSEL array 640 is detected by an optical sensor and fed back to the VCSEL array 640 by a light-quantity control circuit 680.

If a VCSEL array is applied as a light source of an electrophotography apparatus, depending on the printing pattern being used, driving periods of devices may be different. Thus, even though the currents flowing through the devices are equal to one another, the optical outputs obtained from the devices may be different under the influence of heat.

If a monitoring method or a VCSEL array serving as a light source of an electrophotography apparatus according to the present invention is applied, light-emitting devices arranged in an array can be individually monitored with a simple structure.

Sixth Embodiment

Figure 8:
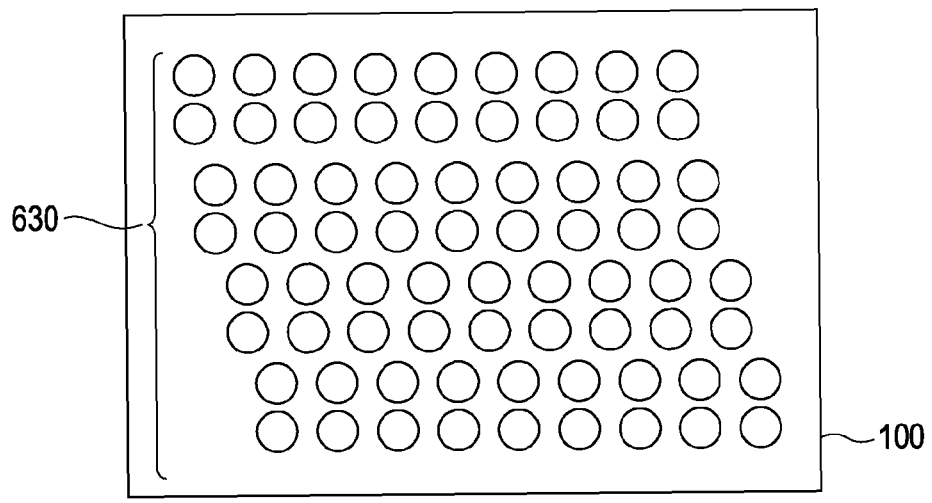
FIG. 8 is a top view of an array in which VCSELs are arranged such that groups of two rows are arranged so as to be shifted in a direction oblique to the vertical direction with respect to each other, and which is used to describe a sixth embodiment according to the present invention.
Figure 9:
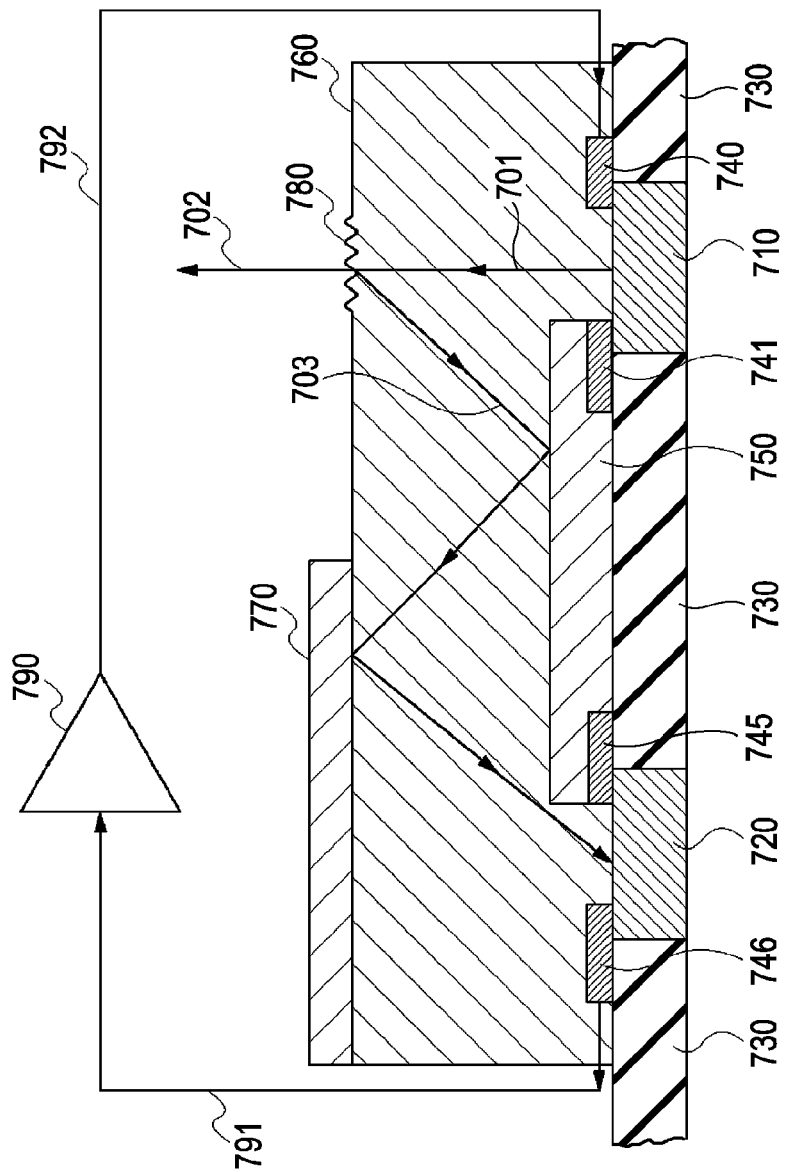
FIG. 9 is a schematic diagram used to describe a monitoring apparatus disclosed in U.S. Pat. No. 5,809,050.

FIG. 8 shows a VCSEL array in which VCSELs denoted by reference numeral 630 are arranged such that groups of two rows are arranged so as to be shifted in a direction oblique to the vertical direction with respect to each other. The monitoring methods in the above-described embodiments can be performed similarly with the arrangement of the VCSELs of such a VCSEL array, and the VCSEL arrays described in the above-described embodiments can be modified to have the arrangement of the VCSELs of such a VCSEL array.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-081800 filed Mar. 27, 2007, which is hereby incorporated by reference herein in its entirety.

What is claimed is:

1. A monitoring method for monitoring an optical output from a VCSEL array in which a plurality of VCSELs are arranged on a substrate, comprising:
    causing a first VCSEL to emit light that is directed parallel to the substrate by changing a bias direction of a voltage applied to the first VCSEL to a forward direction;
    causing a second VCSEL to receive the light emitted from the first VCSEL and to convert the quantity of the light emitted from the first VCSEL into an electric signal by changing a bias direction of a voltage applied to the second VCSEL to a reverse direction;
    causing the second VCSEL to emit light in a direction parallel to the substrate by changing a bias direction of a voltage applied to the second VCSEL to a forward direction; and
    causing a third VCSEL to receive the light emitted from the second VCSEL and to convert the quantity of the light emitted from the second VCSEL into an electric signal by changing a bias direction of a voltage applied to the third VCSEL to a reverse direction.

2. The monitoring method according to claim 1, wherein a bias direction of a voltage applied to at least two second VCSELs is changed to a reverse direction, and thus the light emitted from the first VCSEL is received by the second VCSELs.

3. The monitoring method according to claim 1, wherein the first VCSEL and the third VCSEL are the same device.

4. The monitoring method according to claim 1, wherein a wave of the light that is directed parallel to the substrate and emitted from the first VCSEL is guided inside a resin or a deposited film.

5. The monitoring method according to claim 4, wherein the resin or the deposited film includes at least two resins or deposited films with different refractive indices, respectively.

6. A VCSEL array in which a plurality of VCSELs are arranged on a substrate, comprising:
    a first VCSEL;
    a second VCSEL; and
    a bias-direction switching unit configured to switch a bias direction of a voltage applied to the second VCSEL between forward and reverse.

7. The VCSEL array according to claim 6, wherein at least two second VCSELs are arranged on the substrate, and receive the light that is directed parallel to the substrate and emitted from the first VCSEL.

8. The VCSEL array according to claim 6, wherein a resin or a deposited film is provided between the first VCSEL and the second VCSEL.

9. The VCSEL array according to claim 8, wherein the resin or the deposited film includes at least two resins or deposited films with different refractive indices, respectively, and wherein the resin or the deposited film which is in contact with active layers of the first VCSEL and the second VSCEL has a higher refractive index than other resins or deposited films.

10. An electrophotography apparatus comprising:
a photoconductor;
a charging unit configured to charge the photoconductor;
a light-beam irradiation unit configured to irradiate the charged photoconductor with a light beam used to form an electrostatic image on the charged photoconductor; and
a developing unit configured to develop the electrostatic image formed by the light-beam irradiation,
wherein the VCSEL array according to claim 6 is employed as a light source of the light-beam irradiation unit.

* * * * *